United States Patent
Meyer et al.

(10) Patent No.: US 7,061,126 B2
(45) Date of Patent: Jun. 13, 2006

(54) CIRCUIT BOARD ASSEMBLY

(75) Inventors: Gregory S. Meyer, Roseville, CA (US); Stephan K. Barsun, Sacramento, CA (US); Bryan D. Bolich, Davis, CA (US); S. Daniel Cromwell, Penryn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 73 days.

(21) Appl. No.: 10/680,857

(22) Filed: Oct. 7, 2003

(65) Prior Publication Data

US 2005/0073813 A1 Apr. 7, 2005

(51) Int. Cl.
*H01L 23/544* (2006.01)

(52) U.S. Cl. ................... 257/797; 257/730

(58) Field of Classification Search ........... 257/686, 257/797, 684, 730
See application file for complete search history.

(56) References Cited

U.S. PATENT DOCUMENTS

| | | | |
|---|---|---|---|
| 3,631,297 A * | 12/1971 | Conner | 361/760 |
| 4,321,423 A * | 3/1982 | Johnson et al. | 174/16.3 |
| 4,403,102 A | 9/1983 | Jordan et al. | |
| 4,523,883 A | 6/1985 | Peterson et al. | |
| 4,665,467 A | 5/1987 | Speraw et al. | |
| 4,709,302 A | 11/1987 | Jordan et al. | |
| 4,942,498 A | 7/1990 | Toussaint | |
| 4,953,061 A | 8/1990 | Nitkiewicz | |
| 5,050,038 A | 9/1991 | Malaurie et al. | |
| 5,206,792 A | 4/1993 | Reynolds | |
| 5,276,585 A | 1/1994 | Smithers | |
| 5,311,395 A | 5/1994 | McGaha et al. | |
| 5,379,188 A | 1/1995 | Winslow | |
| 5,394,010 A * | 2/1995 | Tazawa et al. | 257/686 |
| 5,548,487 A | 8/1996 | Brabetz et al. | |
| 5,651,688 A | 7/1997 | Lin | |
| 5,742,844 A | 4/1998 | Feldman | |
| 5,748,446 A | 5/1998 | Feightner et al. | |
| 5,764,485 A | 6/1998 | Lebaschi | |
| 5,870,287 A | 2/1999 | Rodriguez et al. | |
| 5,886,871 A | 3/1999 | Jeffries et al. | |
| 5,896,270 A | 4/1999 | Tsui | |
| 5,915,678 A * | 6/1999 | Slocum et al. | 269/47 |
| 5,928,024 A | 7/1999 | Ming-Huang | |
| 5,930,114 A | 7/1999 | Kuzmin et al. | |

(Continued)

FOREIGN PATENT DOCUMENTS

GB 2 202 993 A 10/1988

OTHER PUBLICATIONS

PEM Bulletin ALA "Floating Self-Clinching Fasteners" PEM Fastening Systems, Danboro, PA, pp. 1-4, 1997.

(Continued)

*Primary Examiner*—Roy Potter

(57) ABSTRACT

A circuit board assembly includes a circuit board, an electronic component, a plurality of incremental detents and at least one projection. The plurality of incremental detents are coupled to one of the circuit board and the electronic component and are retained relative to said one of the circuit board and the electronic component against linear movement in both directions along a first axis. The at least one projection is coupled to the other of the circuit board and the electronic component and is retained against linear movement along the first axis. The at least one projection is received within at least one of the plurality of detents to retain the electronic component relative to the circuit board against linear movement in both directions along the axis.

40 Claims, 7 Drawing Sheets

U.S. PATENT DOCUMENTS

| | | |
|---|---|---|
| 5,940,269 A | 8/1999 | Ko et al. |
| 5,966,289 A | 10/1999 | Hastings et al. |
| 5,986,887 A | 11/1999 | Smith et al. |
| 5,991,154 A | 11/1999 | Clemens et al. |
| 6,055,158 A | 4/2000 | Pavlovic |
| 6,067,231 A | 5/2000 | Lu |
| 6,075,710 A | 6/2000 | Lau |
| 6,084,781 A | 7/2000 | Klein |
| 6,087,199 A * | 7/2000 | Pogge et al. ............. 438/106 |
| 6,108,205 A | 8/2000 | Bergstedt |
| 6,125,038 A | 9/2000 | Amaro et al. |
| 6,128,200 A | 10/2000 | Chu |
| 6,144,092 A | 11/2000 | Kappes et al. |
| 6,147,873 A | 11/2000 | Huang |
| 6,169,659 B1 | 1/2001 | Wheaton |
| 6,191,944 B1 | 2/2001 | Hammel et al. |
| 6,208,518 B1 | 3/2001 | Lee |
| 6,229,705 B1 | 5/2001 | Lee |
| 6,239,974 B1 | 5/2001 | Tseng |
| 6,275,380 B1 | 8/2001 | Bollesen |
| 6,278,615 B1 | 8/2001 | Brezina et al. |
| 6,280,116 B1 | 8/2001 | Szu |
| 6,285,554 B1 | 9/2001 | Westberg |
| 6,297,444 B1 | 10/2001 | Chuang et al. |
| 6,301,115 B1 | 10/2001 | Hashimoto et al. |
| 6,304,449 B1 | 10/2001 | Zhang |
| 6,304,453 B1 | 10/2001 | Lo |
| 6,310,771 B1 | 10/2001 | Chien |
| 6,310,779 B1 | 10/2001 | Wang |
| 6,320,748 B1 | 11/2001 | Roden et al. |
| 6,330,908 B1 | 12/2001 | Lee et al. |
| 6,330,996 B1 | 12/2001 | Yo et al. |
| 6,343,016 B1 | 1/2002 | Lin |
| 6,426,875 B1 | 7/2002 | Akram et al. |
| 6,434,007 B1 | 8/2002 | Salmonson et al. |
| 6,452,801 B1 | 9/2002 | Chen |
| 6,456,493 B1 | 9/2002 | Lee |
| 6,459,584 B1 | 10/2002 | Kuo |
| 6,472,892 B1 * | 10/2002 | Pochmuller ............. 324/755 |
| 6,483,704 B1 | 11/2002 | Ulen et al. |
| 6,487,082 B1 | 11/2002 | Crapisi et al. |
| 6,496,372 B1 | 12/2002 | Davison et al. |
| 6,496,374 B1 | 12/2002 | Caldwell |
| 6,501,657 B1 | 12/2002 | Carr |
| 6,501,658 B1 | 12/2002 | Pearson et al. |
| 6,525,938 B1 | 2/2003 | Chen |
| 6,542,368 B1 | 4/2003 | Miyazawa |
| 6,542,369 B1 | 4/2003 | Wu |
| 6,563,213 B1 | 5/2003 | Wong et al. |
| 6,563,712 B1 | 5/2003 | Akram et al. |
| 6,570,763 B1 | 5/2003 | McHugh et al. |
| 6,590,772 B1 | 7/2003 | Ju |
| 6,617,523 B1 | 9/2003 | McClain et al. |

OTHER PUBLICATIONS

Search Report for Application No. GB0421934.1, 4 pages.

Foreign Search Report for Application No. GB 0 421 934.1 dated Feb. 24, 2005 (1 pg.).

Patents Act 1977 Examination Opinion on application No. GB 0 421 934.1 dated Feb. 25, 2005 (1 pg.).

* cited by examiner

CIRCUIT BOARD ASSEMBLY

CROSS-REFERENCE TO RELATED PATENT APPLICATIONS

The present application is related to co-pending U.S. patent application Ser. No. 10/680,445 filed on the same date herewith by Stephan K. Barsun, Gregory S. Meyer, Bryan D. Bolich and S. Daniel Cromwell entitled "Circuit Board Assembly," the full disclosure of which is hereby incorporated by reference.

BACKGROUND OF THE INVENTION

Computing and electronic devices, such as servers, typically include at least one circuit board, a frame supporting the circuit board and a plurality of electronic components, such as processor components, connected to the circuit board. Many electronic components include a heat sink for dissipating generated heat. The electronic component is typically electrically connected to the circuit board utilizing a pin and socket arrangement. To retain the pins and sockets connecting the electronic component to the circuit board in proper position during dynamic loading and vibration normally experienced by such devices, additional fasteners are employed to further secure the electronic component to the circuit board. Ordinarily, such fasteners comprise threaded bolts which pass through clearance holes in the heat sink and which are threaded or screwed into the frame or into standoffs adhered to the frame.

The pin and socket arrangements typically require precisely controlled spacing to ensure that the pins are properly engaged within the sockets. Unfortunately, standard manufacturing variations or tolerances prevent achieving such precise control over the spacing between the electronic component and the circuit board. The same manufacturing variations further impede the proper alignment of the fasteners with the threaded portions of the frame or the threaded standoffs. Such misalignment further increases the likelihood of accidental damage to the fragile solder joints of the pin and socket arrangements.

BRIEF DESCRIPTION OF THE DRAWINGS

FIG. 7A is a fragmentary side elevational view of the processor system of FIG. 6.

DETAILED DESCRIPTION OF THE EXAMPLE EMBODIMENTS

Figure 1:
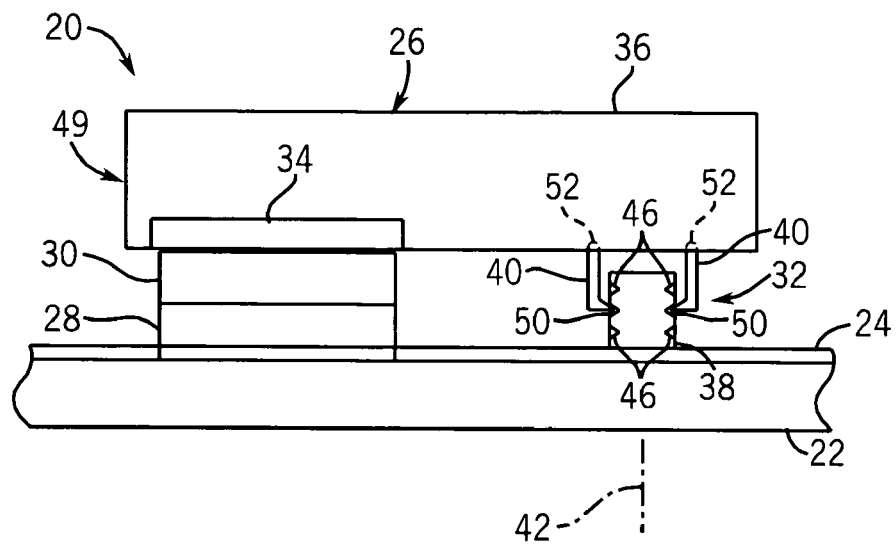
FIG. 1 is a side elevational view schematically illustrating an example of one embodiment of a circuit board assembly of the present invention.

FIG. 1 is a side elevational view schematically illustrating circuit board assembly 20. Circuit board assembly 20 generally includes circuit board 22, frame 24, electronic component 26, connector portion 28, connector portion 30 and electronic component support system 32. Circuit board 22 comprises a conventionally known or future developed circuit board configured to transmit signals to and from various components connected to circuit board 22. Such components may be permanently secured to circuit board 22, such as resistors, capacitors and the like. Other components may be releasably connected to circuit board 22.

Frame 24 comprises a generally rigid structure extending adjacent circuit board 22. Frame 24 rigidifies and supports frame 24. Frame 24 further supports portions of support system 32. In alternative embodiments, frame 24 may be omitted when support system 32 is directly connected to circuit board 22 or to other structures mounted to circuit board 22.

Electronic component 26 comprises an electronic component configured to be releasably connected to circuit board 22. In one embodiment, electronic component 26 may comprise a circuit board connected to circuit board 22. In another embodiment, electronic component 26 may comprise an active component such as an integrated circuit or semiconductor device directly or indirectly connected to circuit board 22. For example, component 26 may include an integrated circuit directly connected to a connector which is connected to printed circuit board 22 or may comprise an integrated circuit connected to a circuit board which is connected to a connector connected to printed circuit 22. The integrated circuit may also be connected to other structures in addition to circuit board 22. For example, electronic component 26 may include an integrated circuit, such as a processor 34, connected to a heat sink 36. The electronic component 26 may also include a power supply (not shown) for supplying power to the processor 34.

Connector portions 28 and 30 engage and connect with one another to connect electronic component 26 to circuit board 22 so as to transmit signals to and from electronic component 26 and circuit board 22. In one embodiment, connector portion 28 may include a plurality of sockets, while connector portion 30 includes a plurality of pins configured to be received within the plurality of sockets. In yet another embodiment, connector portion 28 may include a plurality of sockets, while connector portion 30 includes a plurality of pins. In still other embodiments, connector portions 28 and 30 may comprise other conventionally known or future developed devices for connecting electronic component 26 to circuit board 22 and for transmitting signals in at least one direction between electronic component 26 and circuit board 22.

Electronic component support system 32 supports or assists in supporting and retaining an electronic component 26 relative to circuit board 22 to control the spacing between electronic component 26 and circuit board 22. As a result, support system 32 assists in appropriately supporting connector portions 28 and 30 relative to one another. Support system 32 generally includes support structure 38 and support structures 40.

Support structure 38 is coupled to circuit board 22 and extends along an axis 42 generally perpendicular to circuit board 22. For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

In the particular embodiment illustrated, structure 38 is indirectly coupled to circuit board 22 by frame 24. Support structure 38 is coupled to frame 24 such that support structure 38 is retained against linear movement in both directions along axis 42. In one embodiment, support structure 38 may be integrally formed as part of a single unitary body with frame 24. In another embodiment, support structure may be welded, bonded, fastened or pressed to frame 24.

Support structure 38 includes a plurality of detents 46 incrementally spaced from one another along axis 42. Although schematically illustrated as notches, detents 46 may have a variety of different configurations so as to receive and engage portions of support structure 40. For example, detents 46 may alternatively comprise annular grooves, depressions, bores and the like.

Coupling structures 40 comprise one or more members that are coupled to electronic component 26 to form an electronic component mounting unit 49. Structures 40 are retained against linear movement along axis 42 relative to electronic component 26. Coupling structures 40 include detent-engaging projections 50 which are configured to be received within detents 46. Projections 50 mate or fit within detents 46 so as to engage both an upper and a lower surface of a receiving detent to secure and retain electronic component 26 relative to circuit board 22 in both directions along axis 42. As a result, projections 50 interact with detents 46 to precisely position electronic component 26 and connector portion 30 relative to circuit board 22 and connector portion 28.

To accommodate different spacings between the electronic component 26 and circuit board 22 due to varying tolerances of other structures connecting component 26 and circuit board 22, projections 50 are movably supported for movement between a detent-engaging position in which projections 50 extend into one or more of detents 46 and a withdrawn position in which projections 50 are removed from one or more of detents 46. In the particular embodiment illustrated, structures 40 are pivotally coupled to electronic component 26 for pivotal movement about axes 52. In one embodiment, structures 40 are resiliently biased towards the detent-engaging positions. Such bias may be provided by springs or other biasing mechanisms. For example, a torsion spring may be coupled between electronic component 26 and structure 40 to resiliently bias structures 40 towards the detent-engaging positions.

Although system 32 is illustrated as having structure 38 including three detents 46, structure 38 may be provided with a multitude of uniformly or variably spaced detents 46 along axis 42. Although system 32 is illustrated as including two coupling structures 40, system 32 may alternatively include a fewer or greater number of coupling structures 40. Although projections 50 are illustrated as extending towards one another on the exterior of structure 38, projections 50 may alternatively extend outward away from one another within an interior cavity of structure 38, wherein detents 46 face one another within the interior cavity. Although structure 38 is illustrated as being coupled to circuit board 22, while coupling structures 40 are illustrated as being coupled to electronic component 26, structure 38 may alternatively be coupled to electronic component 26 while coupling structures 40 are coupled to circuit board 22.

Figure 2:
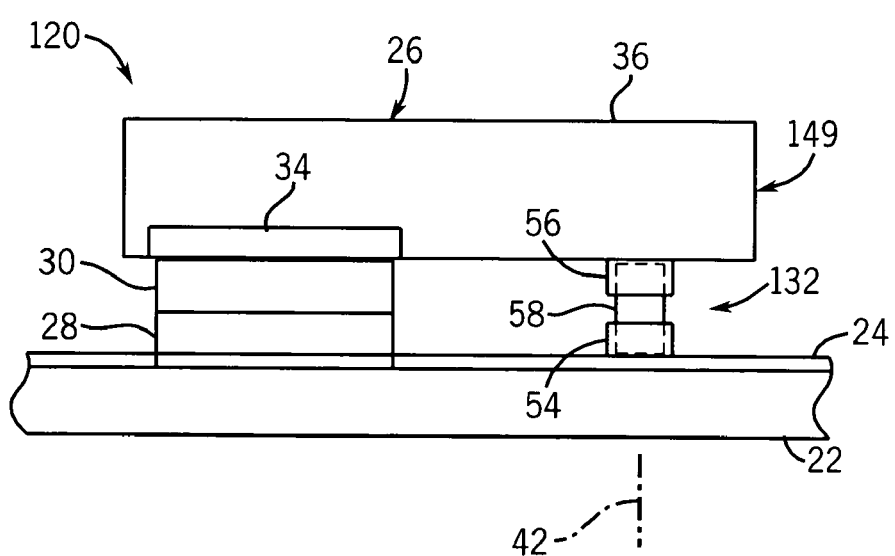
FIG. 2 is a side elevational view schematically illustrating a first alternative embodiment of the circuit board assembly of FIG. 1.

FIG. 2 schematically illustrates circuit board assembly 120, a first alternative embodiment of circuit board assembly 20. Circuit board assembly 120 is substantially identical to circuit board assembly 20 except that circuit board assembly 120 includes electronic component support system 132 in lieu of electronic component support system 32. Those remaining elements of assembly 120 which correspond to elements of assembly 20 are numbered similarly. Like support system 32, support system 132 utilizes detents and projections to adjustably secure and retain electronic component 26 relative to circuit board 22 in both directions along axis 42. However, support system 132 achieves this function with relatively fewer and less expensive components as compared to system 32. System 132 includes support structure 54, support structure 56 and intermediate coupling structure 58. Support structure 54 comprises a structural member coupled to circuit board 22 and retained against linear movement in both directions along axis 42 relative to circuit board 22. In the particular embodiment illustrated, structure 54 is indirectly coupled to circuit board 22 by frame 24. Structure 54 is coupled to coupling structure 58 to retain coupling structure 58 against linear movement in both directions along axis 42. Support structure 54 is coupled to coupling structure 58 so as to permit coupling structure 58 to rotate about axis 42.

Support structure 56 comprises a structural member coupled to electronic component 26 and retained against linear movement in both directions along axis 42 relative to electronic component 26. Structure 56 is coupled to coupling structure 58 to retain coupling structure 58 against linear movement in both directions along axis 42. Support structure 56 is coupled to coupling structure 58 so as to permit coupling structure 58 to rotate about axis 42.

Coupling structure 58 in combination with structure 56, component 26 and connector portion 30 form an electronic component mounting unit 149 for being mounted to circuit board 22. Coupling structure 58 comprises a member extending between structures 54 and 56 and configured to be adjusted relative to at least one of structures 54 and 56 along axis 42 by being rotated about axis 42. Coupling structure 58 is not adjustable along axis 42 by direct linear movement in either direction along axis 42. In the particular embodiment illustrated, coupling structure 58 includes a first externally threaded portion which is screwed to a second internally threaded portion provided by one of structures 54 and 56. As a result, rotation of structure 58 about axis 42 moves the male threads (projections) of structure 58 within the female threads (detents) of one of structures 54 and 56 to accommodate different springs between the electronic component 26 and circuit board 22 due to varying tolerances of other structures connecting component 26 and circuit board 22. Rotation of structure 58 moves the male threads between a detent engaging position in which the male threads are received within a particular set or portion of female threads and a withdrawn position in which the male threads are removed from at least a portion of the particular set of female threads.

In one embodiment, both structures 54 and 56 include internally threaded portions which are both screwed to the externally threaded portion of structure 58. In an alternative embodiment, one of structures 54 and 56 includes an internally threaded portion screwed to the externally threaded portion of structure 58 while the other of structures 54 and 56 merely captures or otherwise retains an end portion of structure 58 so as to permit structure 58 to rotate about axis 42 while retaining structure 58 against linear movement in either direction along axis 42. In one embodiment, coupling structure 58 extends into but not through either or both of structures 54 and 56. In another embodiment, coupling structure 58 passes through one or both of structures 54, 56. In one embodiment, an external threaded portion of coupling structure 58 continuously extends along the entire length of structure 58 along axis 42. In another embodiment, the externally threaded portion of structure 58 includes a plurality of threaded areas spaced along axis 42. Although coupling structure 58 is illustrated as having an external threaded portion, while one or both of structures 54, 56 have internal threaded portions, coupling structure 58 may alternatively have an internal threaded portion or an internally threaded bore while one or both of structures 56 alternatively have an external threaded portion. For example, structure 54 may alternatively be configured to be screwed into an internally threaded bore of structure 58.

Figure 3:
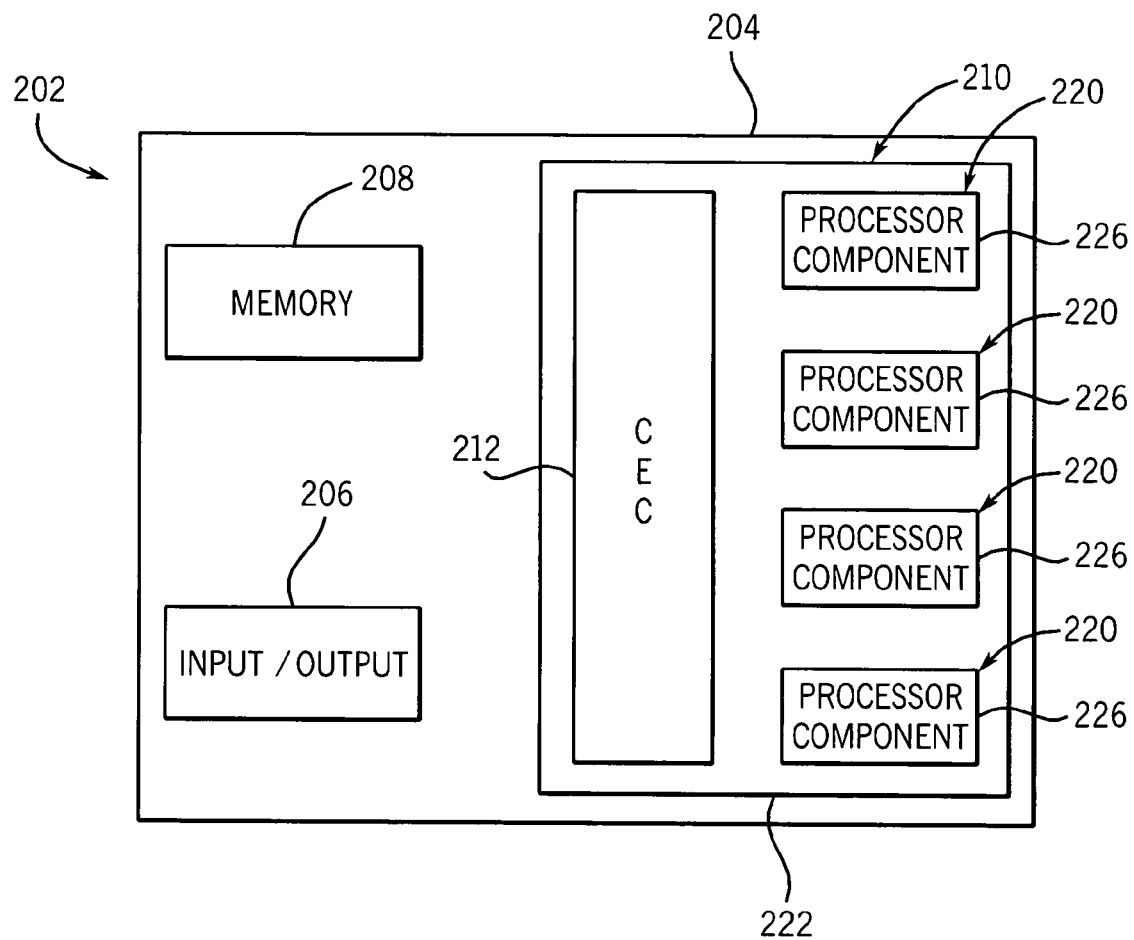
FIG. 3 schematically illustrates a computing device incorporating a second alternative embodiment of the circuit board assembly of FIG. 1.

FIG. 3 schematically illustrates computing device 202 incorporating circuit board assembly 220, a second alternative embodiment of the circuit board assembly shown in FIG. 1. Computing device 202 (shown as a server) generally includes baseboard 204, input/output 206, memory 208 and processor system 210. Base board 204 connects input/output 206, memory 208 and processor system 210 and serves as an electronic highway between such units. Input/output 206 generally comprises an input/output board coupled to baseboard 204. The input/output board generally supports a plurality of input/output cards. Input/output 206 facilitates the use of additional peripherals such as tape drives, DVDs and the like with computing device 202.

Memory 208 is coupled to baseboard 204 and provides additional memory storage for computing device 202. In the particular embodiment shown, memory 208 comprises two memory extenders comprising boards carrying a plurality of memory cards.

Processor system 210 does much of the computing or calculations for computing device 202 and generally includes a processor board or circuit board 222, a plurality of processor components 226 and a control 212 (known as a computer electronic control or CEC). Circuit board 222 generally comprises a conventionally known or future developed circuit board (also known as a printed circuit assembly) capable of serving as an interface between the various elements connected to circuit board 222. Circuit board 222 is coupled to baseboard 204 and electronically connects each of processor components 226 to control 212. In the schematic depiction, circuit board 22 may extend either parallel or perpendicular to base board 204.

Control 212 serves as a traffic cop between each of the processor components 226 and memory 208. Although not shown, computing device 202 may additionally include a power supply for supplying power to each of the components, one or more cooling fans and a housing for enclosing and supporting each of the components. Overall, input/output 206, memory 208 and processor system 210 cooperate with one another to provide information retrieval and processing.

Figure 4:
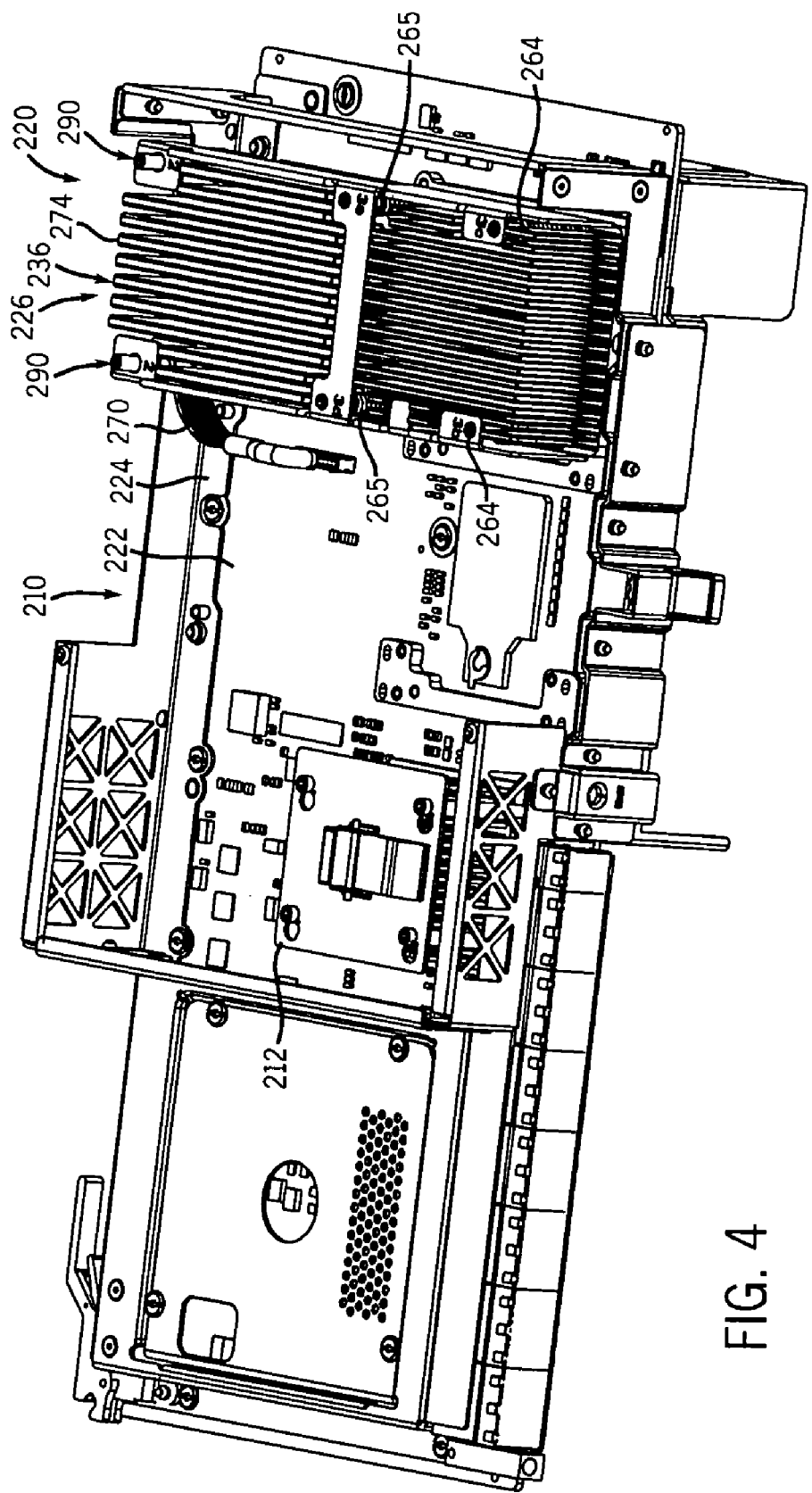
FIG. 4 is a top perspective view of a processor system of the computer device of FIG. 3 incorporating the third alternative embodiment of the circuit board assembly of FIG. 1, with portions omitted for purposes of illustration.
Figure 5:
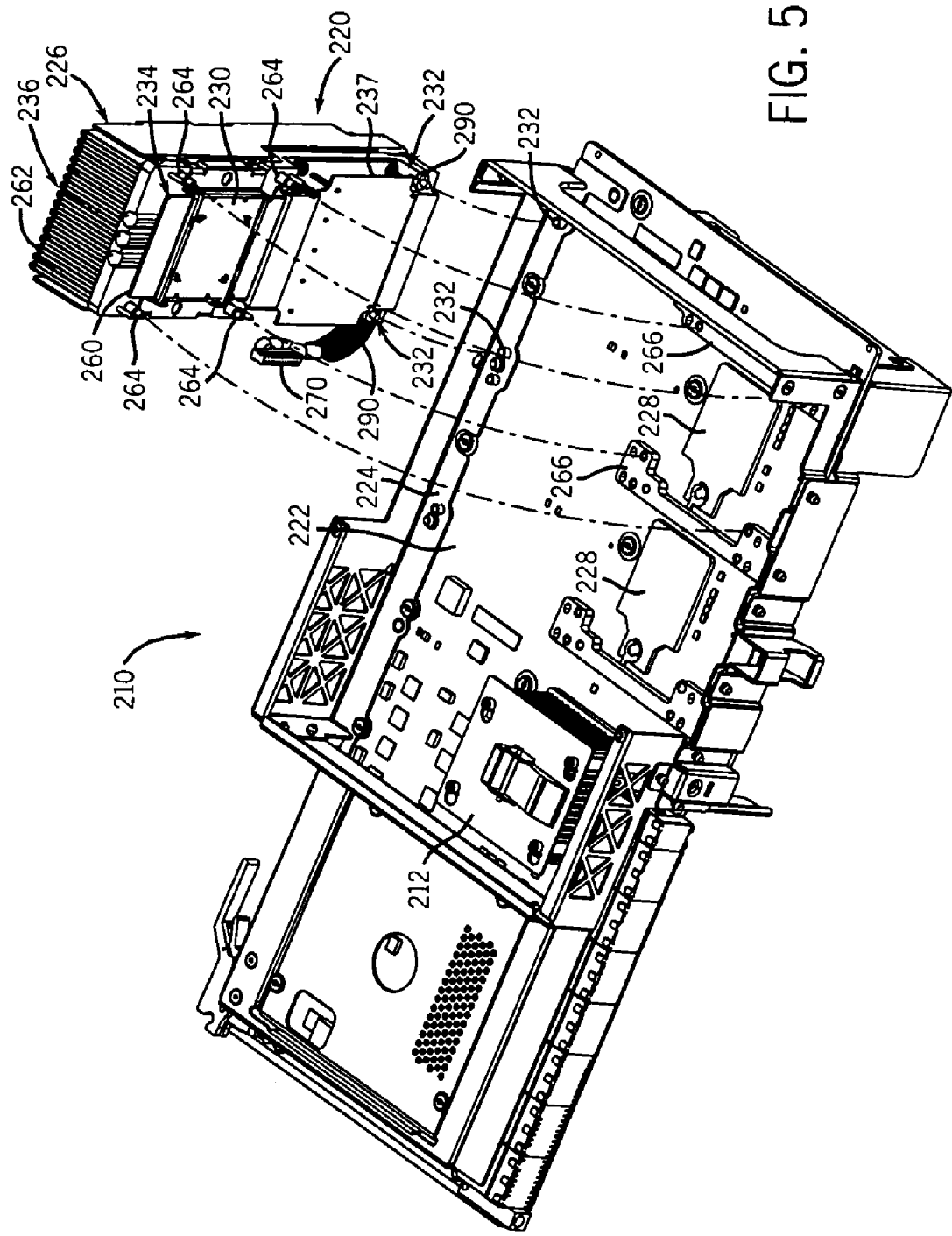
FIG. 5 is a partially exploded perspective view of the processor system of FIG. 4.

FIGS. 4–9 illustrate circuit board assembly 220 incorporated as part of processor system 210. As best shown by FIGS. 4 and 5, circuit board assembly 220 includes circuit board 222, frame 224, processor component 226, connector portion 228, connector portion 230, and component support system 232. Circuit board 222 is generally described above with respect to FIG. 3. However, in the particular embodiment illustrated in FIGS. 5 and 6 in which circuit board 222 is incorporated as part of processor system 210, circuit board 222 is specifically configured to be coupled to four processor components 226 with two processor components 226 on a first side of circuit board 222 and two processor components 226 on a second opposite side of circuit board 222. For ease of illustration, only a single processor component 226 is shown. In alternative embodiments, circuit board 222 may be configured to be connected to a fewer or greater number of processor components 226.

Frame 224 generally comprises a relatively rigid structure extending about a perimeter of circuit board 222 along both faces of circuit board 222. In the particular embodiment illustrated, frame 224 is formed from sheet metal. In alternative embodiments, frame 224 may be formed from other materials and may be cast. In alternative embodiments, frame 224 may have a variety of alternative shapes and configurations depending upon the support requirements of circuit board 222.

Processor component 226 is configured to be releasably mounted to circuit board 222 and generally includes processor assembly 234, heat sink assembly 236 and power supply 237. Processor assembly 234 includes a conventionally known or future developed integrated circuit chip (not shown) configured to process information provided to it through circuit board 222. The circuit chip is mounted upon a circuit board 260 by which the chip is connected to connector portion 230.

Heat sink assembly 236 includes heat sink 262 and heat sink mounting members 264. Heat sink 262 generally comprises a structure thermally coupled to integrated circuit chip of processor assembly 234 and also thermally coupled to power supply 237 to dissipate heat generated by processor assembly 234 and by power supply 237. In the embodiment shown, heat sink 262 is adjacent the circuit chip and power supply 237.

Mounting members 264 generally comprise projections or members extending from heat sink 262 about connector portion 230. Mounting members 264 include threaded portions that are screwed into brackets 266 which are secured to frame 224 and which extend about connector portion 228. In alternative embodiments, mounting members 264 may be screwed to standoffs or other structures. In the particular embodiment illustrated, heat sink assembly 236 includes four mounting members 264 located at each corner of connector portion 230. One example of a mounting member 264 (also known as a mounting portion) is described in co-pending U.S. patent application Ser. No. 10/661,433 filed on Sep. 12, 2003 by Gregory S. Meyer and Alisa C. Sandoval, and entitled "Circuit Board Assembly," the full disclosure of which is hereby incorporated by reference.

Power supply 237 comprises a conventionally known or future developed device configured to transmit power to processor assembly 234. Power supply 237 is secured adjacent to heat sink 262 generally between heat sink 262 and circuit board 222. Power supply 237 is connected to circuit board 222 by cabling 270. Because power supply 237 is generally suspended above circuit board 222, the weight of power supply 237 and an adjacent portion of heat sink 262 are generally suspended or cantilevered with respect to circuit board 222. As will be described in greater detail hereafter, support system 232 supports this cantilevered mass relative to circuit board 222 to minimize pivoting of connector portions 228 and 230 about the resulting fulcrum and to avoid potential damage to connector portions 228 and 230. In alternative applications, power supply 237 may be provided by a separate component coupled to circuit board 22, wherein system 32 supports a cantilevered mass of heat sink 262.

Connector portions 228 and 230 are configured to interact with one another to connect processor assembly 234 to circuit board 222 and to facilitate the transmission of signals therebetween. Connector portion 228 is coupled to circuit board 222 and includes a plurality of sockets. Connector portion 226 is coupled to component 226 and includes a plurality of pins which are received within the plurality of sockets of connector portion 228. In the particular embodiment illustrated, connector portions 228 and 230 comprise a conventionally known zero-in-force (ZIF) connector sold by Tyco and Foxcom for use with Intel processors. In alternative embodiments, connector portions 228 and 230 may comprise other conventionally known or future developed connection devices configured to facilitate the transmission of signals between circuit board 222 and processor assembly 234.

Figure 6:
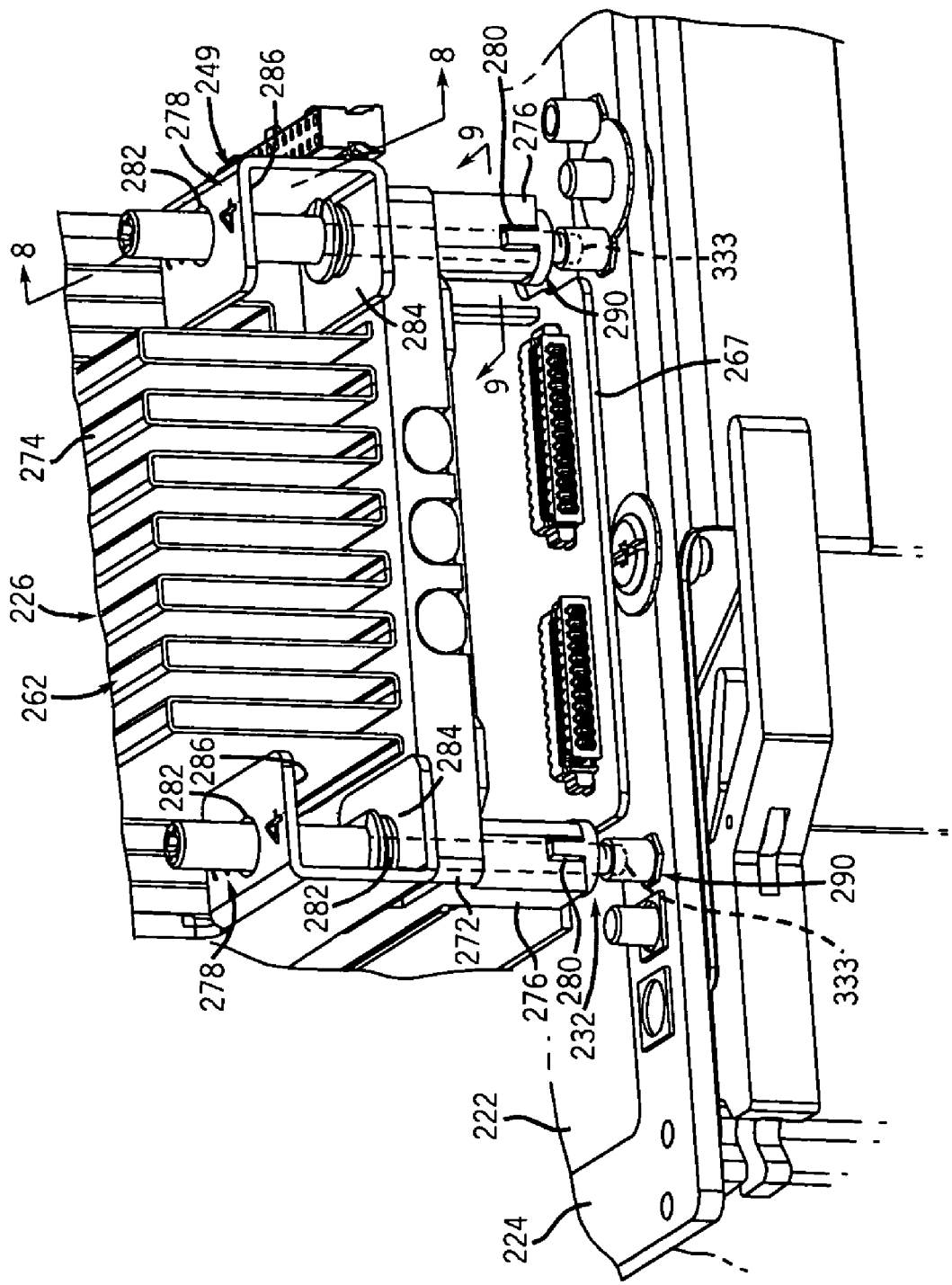
FIG. 6 is an enlarged fragmentary perspective view of the processor system of FIG. 4.

FIGS. 6–9 illustrate portions of processor component 226 and support system 232 in greater detail. As best shown by FIG. 6, heat sink 262 includes platform 272, cooling fins 274, post 276 and brackets 278. Platform 272 generally comprises a structure to which processor assembly 234 and power supply 237 are mounted. Platform 272 additionally supports cooling fins 274, posts 276 and brackets 278. Platform 272 may have a variety of sizes and configurations depending upon the size and configuration of processor assembly 234 and power supply 237.

Posts 276 extend from platform 272 towards circuit board 222 and frame 224. In the particular embodiment illustrated, posts 276 are integrally formed as part of a single unitary body with platform 272. In alternative embodiments, posts 276 may be mounted, welded, adhered or fastened to platform 272. Posts 276 interact with and receive portions of support system 232. In particular, each post 276 includes a pair of openings 280 which interact with portions of a support system 232 to prevent complete rotation of those portions of support system 232.

Cooling fins 274 are coupled to platform 272 and extend generally opposite to processor assembly 234 and power supply 237. Cooling fins 262 provide an enlarged surface area for the dissipation of heat.

Brackets 278 extend along opposite edges of platform 272 and are configured to interact with portions of support system 232. In particular, each bracket 278 includes a pair of aligned openings 282 through which portions of support system 232 extend. In addition, brackets 278 include opposing surfaces 284, 286 which capture and retain other portions of support system 232 as will be described in greater detail hereafter.

Figure 7:
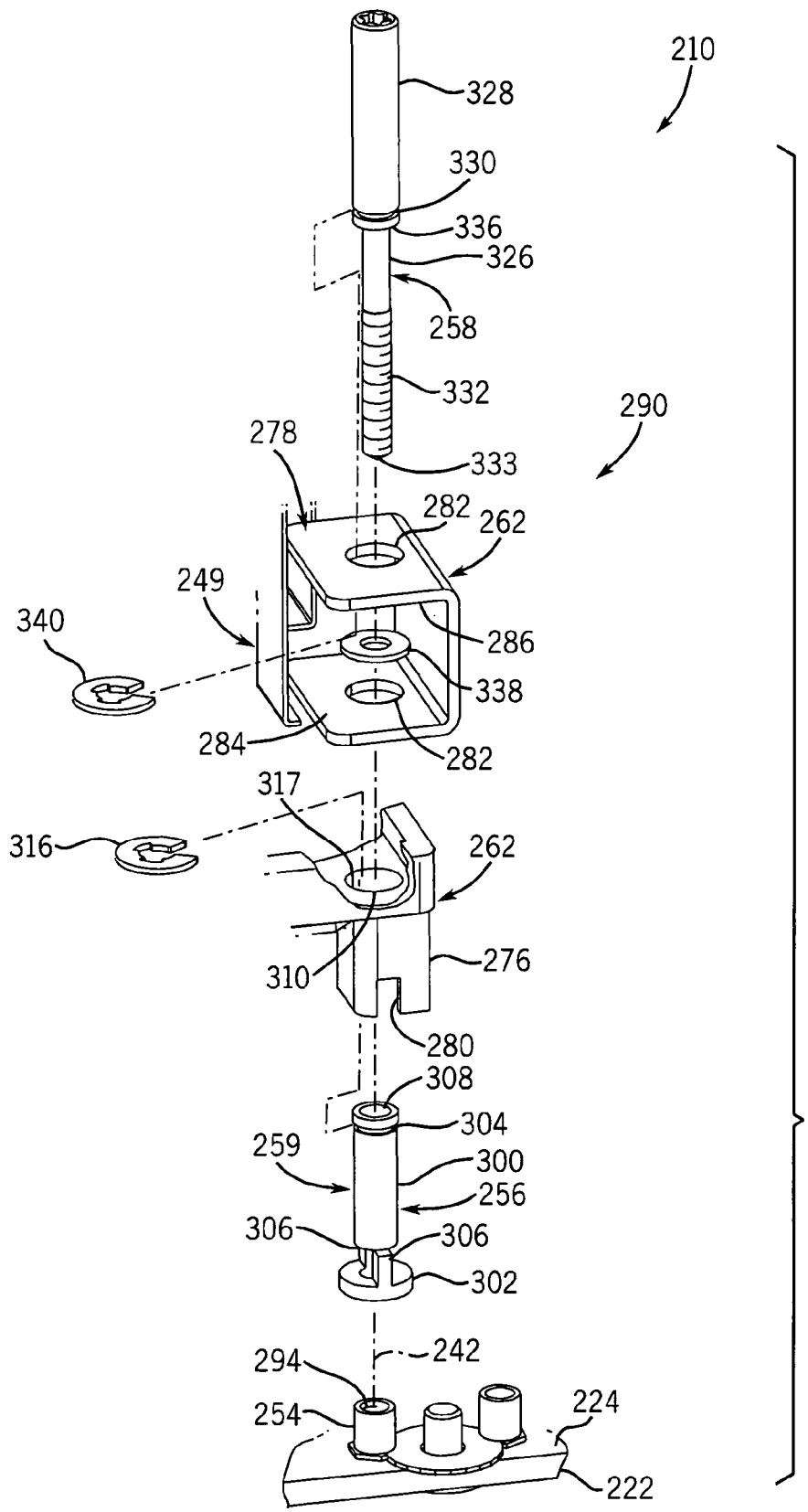
FIG. 7 is a fragmentary exploded perspective view of a support assembly of the processor system of FIG. 6.

Support system 232 supports the cantilevered mass of electronic component 226 relative to circuit board 222 to prevent damage to connector portions 228 and 230. Support system 232 includes two support assemblies 290 generally located in the corners of an end of electronic component 226 most distant from connector portion 230. FIG. 7 illustrates a single support assembly 290 and interacting portions of heat sink 262 in greater detail. As best shown by FIG. 7, support assembly 290 includes support structure 254, support structure 256 and intermediate coupling structure 258. Support structure 254 generally comprises a structure that is configured to be coupled to circuit board 222 so as to be retained against linear movement in both directions along axis 242. Structure 254 is further configured to be coupled to circuit board 222 so as to be retained against rotation about axis 242. Support 254 is further configured to interact with coupling structure 258 so as to retain coupling structure 258 against linear movement relative to circuit board 222 along axis 242. In the particular embodiment illustrated, support structure 254 includes an internally threaded bore 294 providing a threaded portion configured to threadably engage portions of structure 258. In the particular embodiment illustrated, structure 254 comprises a conventionally known nut, such as a PEM threaded fastener sold by Pen Engineering, pressed into frame 224 and extending towards heat sink 262.

Support structure 256 comprises a structure configured to be coupled to electronic component 26 so as to be retained against linear movement in both directions along axis 242. At the same time, structure 256 is configured to be coupled to an electronic component 226 so as to be movable relative to electronic component 226 in at least one direction perpendicular to axis 242. Structure 256 is further configured to be coupled to coupling structure 258 so as to retain coupling structure 258 against linear movement relative to structure 256 and relative to electronic component 226 in both directions along axis 242. In the particular embodiment illustrated, coupling structure 256 includes body 300, cap 302, groove 304, wings 306 and internally threaded bore 308.

Body 300 defines groove 304 and internally threaded bore 308 and extends through passage 310 formed within post 276 of heat sink 262. Body 300 is dimensioned smaller than passage 310 to facilitate movement of body 300 within passage 310 in a direction perpendicular to axis 242. In the embodiment illustrated, body 300 is dimensioned smaller than passage 310 by a distance sufficient to allow adequate movement of body 300 to accommodate manufacturing variations. At the same time, body 300 is not dimensioned smaller than passage 310 by such a large distance that support structure 258, when passed through body 300, may completely miss bore 294 when component 226 is being mounted to circuit board 222. In one embodiment, the interior of passage 310 and the exterior surfaces of body 300 are spaced from one another by an annular gap having a radial width of between about 0.3 mm to 0.9 mm (a total gap of 0.6 mm to 1.8 mm). In the particular embodiment illustrated, passage 310 is spaced from the exterior of body 300 by an annular gap having a radial width of approximately 0.5 mm. In the particular embodiment illustrated, both body 300 and passage 310 are cylindrical in shape. In alternative embodiments, body 300 and passage 310 may have other shapes.

Figure 8:
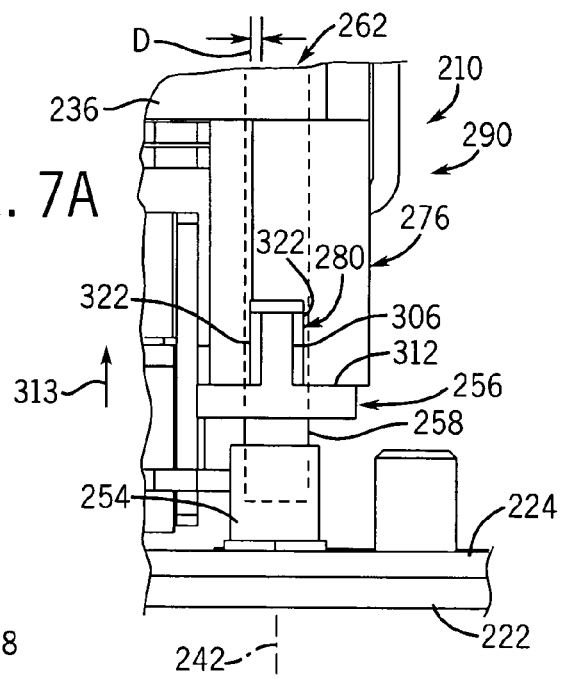
FIG. 8 is a sectional view of the processor system of FIG. 6 taken along line 8—8.
Figure 9:
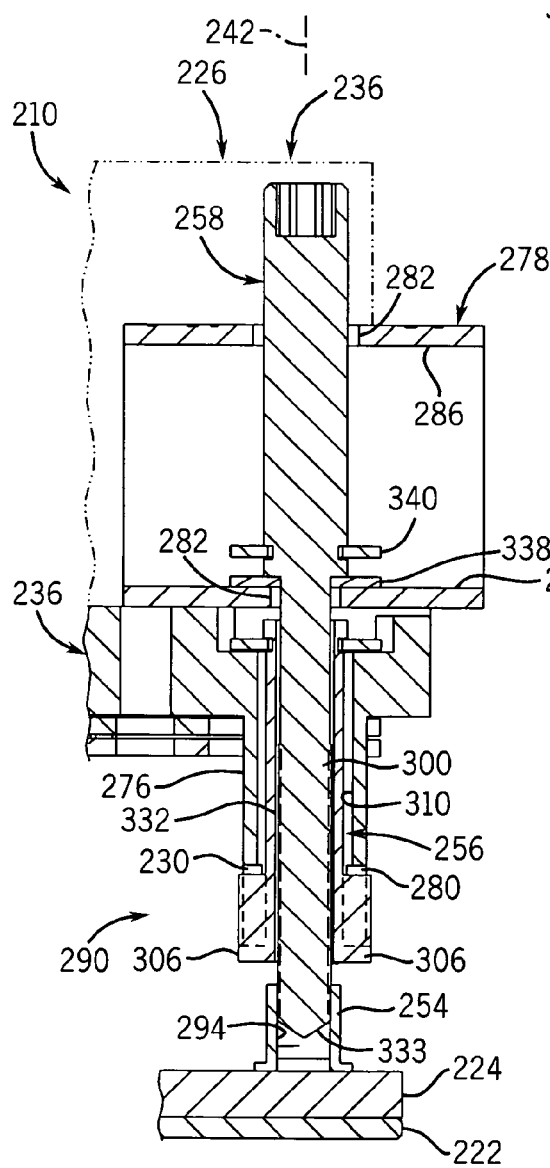
FIG. 9 is a fragmentary sectional view of the processor system of FIG. 6 taken along line 9—9.

Cap 302 and groove 304 are generally located proximate to opposite ends of body 300 and are configured to engage post 276 to retain body 300 against linear movement in both directions along axis 242. As best shown by FIGS. 7A and 9, cap 302 is coupled to body 300 and abuts axially facing surface 312 of post 276 to retain body 300 against linear movement along axis 242 in the direction indicated by arrow 313. As shown by FIGS. 8 and 9, groove 304 receives a snap ring 316, such as an E-ring, which extends beyond passage 310 so as to abut the opposite axially facing surface 317 of post 376 to retain body 300 against linear movement along axis 242 in the direction indicated by arrow 319.

Although body 300 is illustrated as being retained against linear movement along axis 242 in both directions by cap 302, groove 304 and snap ring 316, body 300 may alternatively be coupled to electronic component 226 so as to be retained against linear movement in both directions along axis 242 by other retaining mechanisms. For example, in lieu of cap 302 being integrally formed as part of a single unitary body of body 300, cap 302 may alternatively be welded, bonded or fastened to body 300. Cap 302 may be releasably coupled to body 300. For example, cap 302 may comprise a snap ring releasably fastened to body 300. In such applications where cap 302 is releasably connected to body 300, snap ring 316 may be replaced with cap or radially extending projection integrally formed as part of body 300 or permanently coupled to body 300. In alternative embodiments, body 300 may be provided with one or more axially facing surfaces which are abutted by an opposite shoulder or axially facing surface extending within passage 310 from post 376 or by a snap ring or similar structure releasably coupled to post 276 within an annular groove formed along passage 310.

As best shown by FIGS. 7A and 8, wings 306 extend from body 300 and are configured to be received within openings 280 of post 276. Wings 306 engage one of edge surfaces 322 of opening 280 during initial rotation to prevent complete rotation about axis 242. Edge surfaces 322 are generally spaced from one another and spaced from wings 306 by a distance sufficient to permit body 300 to move in a direction perpendicular to axis 242 within passage 310. To facilitate sufficient movement of body 300 within passage 310, opposing edge surfaces 322 of openings 280 are spaced from one another by a distance D at least the amount of gap G (at least 0.3 mm to 0.9 mm). In the particular embodiment illustrated, edge surfaces 322 are spaced from the opposite edges of wings 306 to permit rotation of body 300 by approximately 10 degrees. Because wings 306 prevent body 300 from completely rotating about axis 242, structure 258 may be screwed into internally threaded bore 308.

In alternative embodiments, other structures may be employed to key or retain body 300 against complete rotation about axis 242. For example, body 300 and passage 310 may be provided with non-symmetrical cross-sectional shapes such as oval or D-shape.

Interior threaded bore 308 extends through body 300, between wings 306 and through cap 302. As shown by FIG. 9, portions of bore 308 are internally threaded for being screwed to coupling structure 258. In alternative embodiments, the entirety of bore 308 may be internally threaded or bore 308 may be provided with spaced threaded areas along its interior.

Coupling structure 258 in combination with structure 256, component 226 and connector portion 230 form an electronic component mounting unit 249 for mounting to circuit board 222 and its connector portion 228. Coupling structure 258 cooperates with structure 256 to form a floating coupler 259 for coupling an electronic component, such as component 226, to a circuit board, such as circuit board 222. Coupling structure 258 interacts with both support structure 254 and support structure 256 to couple electronic component 226 to circuit board 222 and to precisely retain component 226 relative to circuit board 222 along axis 242 during vibration and loading. Structure 258 generally includes shank portion 326, head portion 328 and annular groove 330. Shank portion 326 has a length sufficient so as to extend through bore 308 of body 300 and into bore 294 of support structure 254. Shank portion 326 includes an externally threaded portion 332 extending along at least a part of its length. In alternative embodiments, threaded portion 332 may extend along the entire length of shank portion 326 or may be intermittently spaced along the length of shank portion 326.

Shank portion 326 additionally includes a tapered end portion 333. Taped end portion 333 engages structure 254 to assist in aligning structure 258 with bore 294. As structure 258 is moved along axis 242 towards bore 294, tapered end portion 333 engages the lip or mouth of bore 294. Due to its tapered, sloped or ramped surface, engagement of end portion 333 with the lip or mouth of bore 294 moves structure 258 and structure 256 in a direction perpendicular to axis 242 as structure 258 is moved along axis 242 towards structure 254. This automatic alignment of structure 258 with bore 294 along axis 242 facilitates easier mounting of component 226 to circuit board 222. In alternative embodiments, the mouth of bore 294 may be funnel-shaped to provide such automatic alignment. In still other embodiments, end portion 333 may omit such tapering, requiring iterative movement of structure 258 to align structure 258 with bore 294.

Head portion 328 extends from shank portion 326 and is generally larger than shank portion 326 so as to form a shoulder 336. Shoulder 336 is dimensioned so as to bear against a washer 338 which bears against surface 284 of bracket 278. Shoulder 336 and washer 338 cooperate with surface 284 to limit movement of structure 258 along axis 242.

Groove 330 is formed within head portion 328 and configured to receive a snap ring 340, such an E-ring. Snap ring 340 extends beyond the upper opening 282 shown in FIG. 7 to retain coupling structure 258 relative to bracket 278 once coupling structure 258 is inserted through openings 282. As a result, coupling structure 258 may be coupled or mounted to component 226 to form mounting unit 249 prior to being mounted to circuit board 222. In alternative embodiments, groove 330 and snap ring 340 may be omitted.

As best shown by FIGS. 8 and 9, support assembly 290 is assembled by inserting structure 256 into passage 310 with wing 306 positioned within openings 280. Once grooves 304 are positioned beyond surface 317 of heat sink 262, snap ring 316 is positioned within groove 304 to axially retain structure 256 along axis 242. Washer 338 is aligned with and between openings 282. Coupling structure 258 is inserted through washer 338 and through openings 282. Snap ring 340 is then secured within groove 330. According to one method, coupling structure 258 is inserted through washer 338 and through openings 282 and snap ring 340 is inserted within groove 330 during the manufacture and assembly of component 226 and mounting unit 249 even prior to the insertion of structure 256 into passage 310. According to yet alternative methods, the insertion of snap ring 340 into groove 330 may be omitted.

Coupling structure 258 is rotated about axis 242 to screw threaded portion 332 into the threaded portion provided by interior threaded bore 308. Body 300 is moved in a direction perpendicular to axis 242 so as to align bore 308 with bore 294. In the particular embodiment shown, the point of structure 258 engages structure 256 to automatically line up bores 308 and 294 along axis 242. Once bores 308 and 294 have been properly aligned, coupling structure 258 is further rotated so as to screw threaded portion 332 into threaded bore 294 of support structure 254. Coupling structure 258 is rotated in either direction about axis 242 to appropriately position processor component 226 relative to circuit board 222 in the direction along axis 242 so as to reduce loading upon connector portions 228 and 230 so as to reduce the possibility of accidental damage to connector portions 228 and 230. Coupling structure 258 accommodates varying established positions at the processor component 226 with respect to the circuit board 222 depending upon the pitch (approximately m 3×0.5 mm) of threaded portion 332. At the same time, the inter-engagement of threaded portions 332 of the threaded portion of bore 308 and of the threaded portion of bore 294 retain processor component 226 relative to circuit board 222 and against linear movement in both directions along axis 242. In the particular embodiment shown, structures 258 are generally of equal or greater strength than mounting members 264. Thus, no special attention is required during torquing structures 258. The same procedure is repeated for the other support assembly 290.

In lieu of inserting coupling structure 258 into support structure 256 and then moving support structure 256 in a direction perpendicular to axis 242 to align bore 308 with bore 294, body 300 may be moved in a direction perpendicular to axis 242 to align bores 308 and 294 prior to insertion of coupling structure 258. Although support assembly 290 is illustrated as including washer 338, snap ring 340 and spring 342 which interact with bracket 278, such elements, as well as brackets 278, may be omitted. In other embodiments, washer 338 may be omitted where head portion 328 is larger relative to opening 282.

The overall process of mounting processor component 226 to circuit board 222 is as follows. Connector portion 230 is first connected to connector portion 228. In the particular embodiment illustrated, the pins of connector portion 230 are inserted into the corresponding sockets of connector portion 228. The connection of connector portion 230 and connector portion 228 further involves actuation of interconnect lever to shift the pins within the sockets as conventionally known with respect to ZIF connectors. Each of mounting members 264 are then secured to brackets 266. In the particular embodiment illustrated, mounting members 264 comprise screws which are tightened to control a clamping force provided by load springs 265 (shown in FIG. 4) and to set the spacing between component 226 and circuit board 222 (the "Z-axis" height). Thereafter, both support assemblies 290 are mounted relative to circuit board 222 as described above to support the cantilevered mass of component 226.

Although support system 232 is illustrated as having a floating coupling structure 256 movably coupled to electronic component 226, system 232 may alternatively have a floating structure movably coupled to frame 224 or to circuit board 222. For example, in one alternative embodiment, support structure 254 and coupling structure 256 may be replaced with a conventionally known floating fastener, such as PEM AS or AC series fastener sold by Pen Engineering, 5190 Old Easton Road, Danboro, Pa. 18916. With such an alternative embodiment, component 226 is provided with an internally threaded structure stationarily secured to electronic component 226 so as to be retained in both directions along axis 242. Support structure 258 is threaded through the internally threaded structure coupled to electronic component 226 and further threaded into the floating portion of the PEM floating fastener coupled to circuit board 222 and retained in both directions along axis 242. Although such an alternative embodiment would be more prone to cross threading and misalignment since structure 258 would be locked in place so as to miss the floating second hole and although such floating PEM fasteners tend to take up much more space on frame 224, this alternative embodiment would still provide some flexibility for accommodating manufacturing variations and tolerance stack.

Although the present invention has been described with reference to example embodiments, workers skilled in the art will recognize that changes may be made in form and detail without departing from the spirit and scope of the invention. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present invention described with reference to the example embodiments and set forth in the following claims is manifestly intended to be as broad as possible. For example, unless specifically otherwise noted, the claims reciting a single particular element also encompass a plurality of such particular elements.

What is claimed is:

1. A circuit board assembly comprising:
   a circuit board;
   an electronic component;
   a plurality of incremental detents coupled to one of the circuit board and electronic component and retained relative to said one of the circuit board and electronic component against linear movement in both directions along a first axis; and
   at least one projection coupled to the other of the circuit board and the electronic component and retained relative to the other of the circuit board and the electronic component against linear movement along the first axis, wherein the at least one projection is configured to be selectively received within at least a selected one of the plurality of detents to adjust and retain a spacing of the electronic component relative to the circuit board along the first axis.

2. The circuit board assembly of claim 1, wherein the first plurality of incremental detents is provided by a first threaded portion and wherein the at least one first projection is provided by a second threaded portion screwed to the first threaded portion.

3. The circuit board assembly of claim 2 including a first intermediate structure having the first threaded portion and rotatably coupled to said one of the circuit board assembly and the electronic component while retained against linear movement in both directions along the first axis.

4. The circuit board assembly of claim 3 including a third threaded portion coupled to said one of the circuit board assembly and the electronic component against linear movement in both directions along the first axis, wherein the third threaded portion is screwed to the first threaded portion to retain the first intermediate structure and the first threaded portion against linear movement in both directions along the first axis.

5. The circuit board assembly of claim 4, wherein the third threaded portion is releasably coupled to said one of the circuit board assembly and the electronic component.

6. The circuit board assembly of claim 4 including:
   a second intermediate member extending along a second axis and including a fourth threaded portion;
   a fifth threaded portion coupled to one of the circuit board assembly and the electronic component and retained against linear movement in both directions along the second axis, the fifth threaded portion being screwed to the fourth threaded portion; and
   a sixth threaded portion coupled to the other of the circuit board assembly and the electronic component and retained against linear movement in both directions along the second axis, the sixth threaded portion being screwed to the fourth threaded portion.

7. The circuit board assembly of claim 6, wherein the fifth threaded portion is releasably coupled to said one of the circuit board assembly and the electronic component.

8. The circuit board assembly of claim 4 including:
a processor assembly;
a heat sink coupled to the processor assembly; and
a first connector portion coupled to the processor assembly, wherein the circuit board assembly further includes a second connector portion coupled to the circuit board assembly and releasably connected to the first connector portion.

9. The circuit board assembly of claim 8 including a power supply configured to supply power to the processor assembly and having a mass cantilevered relative to the circuit board, wherein the first threaded portion, the second portion and the third threaded portion cooperate to support the cantilevered mass relative to the circuit board.

10. The circuit board assembly of claim 8, wherein the first connector portion includes one of a plurality of pins and wherein the second connector portion includes the other of a plurality of sockets removably receiving the plurality of pins.

11. The circuit board assembly of claim 8, wherein the third threaded portion is coupled to the heat sink.

12. The circuit board assembly of claim 11, wherein the heat sink includes a post incorporating the third threaded portion.

13. The circuit board assembly of claim 11 including:
a second intermediate structure extending along a second axis and having a fourth threaded portion;
a fifth threaded portion coupled to the heat sink and retained against linear movement in both directions along the second axis, the fifth threaded portion screwed to the fourth threaded portion; and
a sixth threaded portion coupled to the circuit board assembly and retained against linear movement in both directions along the second axis, the sixth threaded portion being screwed to the fourth threaded portion.

14. The circuit board assembly of claim 13, wherein the first intermediate structure and the second intermediate structure are located on a first side of the processor assembly and wherein the circuit board assembly further includes:
a first plurality of mounting members coupling the circuit board assembly to the heat sink on a second opposite side of the processor assembly.

15. The circuit board assembly of claim 14 including a second plurality of mounting members coupling the circuit board assembly to the heat sink, the second plurality of mounting members being located between the processor assembly and the first and intermediate members.

16. The circuit board assembly of claim 15, wherein the first plurality of mounting members and the second plurality of mounting members load the first connector portion into connection with the second connector portion.

17. The circuit board assembly of claim 4, wherein the electronic component includes a post including the third threaded portion.

18. The circuit board assembly of claim 17, wherein the third threaded portion is releasably coupled to the post.

19. The circuit board assembly of claim 1, wherein the electronic component includes a power supply having a mass cantilevered relative to the circuit board, wherein the plurality of incremental detents and the at least one projection cooperate to support the cantilevered mass relative to the circuit board.

20. An electronic component mounting unit for use with a circuit board, a first threaded portion coupled to the circuit board and an intermediate structure having a second threaded portion screwed to the first threaded portion along an axis, the unit comprising:

an electronic component; and
a third threaded portion coupled to the electronic component, wherein the third threaded portion is configured to be screwed to the second threaded portion to retain the electronic component relative to the circuit board in both directions along the axis.

21. The unit of claim 20, wherein the electronic component includes a heat sink.

22. The unit of claim 21, wherein the third threaded portion is coupled to the heat sink.

23. The unit of claim 22, wherein the third threaded portion is removably coupled to the heat sink.

24. The unit of claim 21, wherein the circuit board includes a first connector portion and wherein the electronic component includes a processor assembly coupled to the heat sink and including a second connector portion configured to connect to the first connector portion.

25. A computing device comprising:
a baseboard;
a memory coupled to the baseboard;
input/output coupled to the baseboard; and
a processor system coupled to the baseboard, the processor system including:
a frame;
a circuit board; and
a processor component including:
a processor assembly; and
a heat sink coupled to the processor assembly;
a plurality of incremental detents coupled to one of the processor component and the circuit board and retained against linear movement in both directions along an axis extending perpendicular from the circuit board; and
at least one projection coupled to the other of the circuit board and the electronic component and retained against linear movement in both directions along the axis, wherein the at least one projection is received within at least one of the plurality of detents to retain the electronic component relative to the circuit board against movement in both directions along the axis.

26. The device of claim 25, wherein the first plurality of incremental detents comprises a first threaded portion and wherein the at least one first projection comprises a second threaded portion screwed to the first threaded portion.

27. The device of claim 26 including an intermediate structure having the first threaded portion and rotatably coupled to said one of the circuit board and the electronic component while being retained against linear movement in both directions along the axis.

28. The device of claim 27 including a third threaded portion coupled to said one of the circuit board and the electronic component against linear movement in both directions along the axis, wherein the third threaded portion is screwed to the first threaded portion to retain the intermediate structure and the first threaded portion against linear movement in both directions along the axis.

29. The device of claim 28, wherein the third threaded portion is releasably coupled to said one of the circuit board and the electronic component.

30. A circuit board assembly comprising:
a circuit board;
an electronic component; and
means for adjustably positioning the electronic component in one of a plurality of positions relative to the circuit board in both directions along an axis substantially perpendicular to the circuit board and maintaining the electronic component in said one of the plurality of positions relative to the circuit board against linear movement in both directions along the axis.

31. A circuit board assembly comprising:
a circuit board;
an electronic component;
a first threaded portion coupled to the electronic component so as to be retained in both directions along an axis relative to the electronic component;
a second threaded portion coupled to the circuit board; and
an intermediate structure along the axis having a third threaded portion screwed to the first threaded portion and screwed to the second threaded portion.

32. The assembly of claim 31, wherein the first threaded portion comprises a first internally threaded bore, wherein the second threaded portion comprises a second internally threaded bore and wherein the third threaded portion of the intermediate structure is screwed into the first threaded bore and into the second threaded bore.

33. A method for mounting an electronic component to a circuit board, the method comprising:
positioning at least one projection, coupled to one of the electronic component and the circuit board and retained against linear movement along an axis perpendicular to the circuit board, within at least one of a plurality of incremental detents, extending along the axis and coupled to the other of the circuit board and the electronic component and retained against linear movement in both directions along the axis; and
repositioning the at least one projection and the at least one incremental detent relative to one another to adjust a spacing between the electronic component and the circuit board.

34. The method of claim 33, wherein the plurality of incremental detents are provided by a first threaded portion and wherein the at least one projection is provided by a second threaded portion and wherein the inserting step includes screwing the first threaded portion to the second threaded portion.

35. The method of claim 34, wherein said one of the circuit board and the electronic component includes a third threaded portion, wherein the first portion is provided by an intermediate structure and wherein the method further includes the step of screwing the first threaded portion to the third threaded portion.

36. The method of claim 33, wherein the electronic component includes a processor assembly and a heat sink coupled to the processor assembly and wherein the method further includes connecting the processor assembly to the circuit board.

37. The method of claim 36 further including securing a plurality of mounting members between the electronic component and the circuit board about the processor assembly.

38. The unit of claim 20, wherein the third threaded portion is configured to facilitate adjustable spacing of the component relative to the circuit board in both directions along the axis.

39. A circuit board assembly comprising:
a circuit board;
an electronic component;
a plurality of incremental detents coupled to one of the circuit board and electronic component and retained relative to said one of the circuit board and electronic component against linear movement in both directions along a first axis;
at least one projection coupled to the other of the circuit board and the electronic component and retained against linear movement along the first axis, wherein the at least one projection is received within at least one of the plurality of detents to retain the electronic component relative to the circuit board against linear movement in both directions along the first axis, wherein the first plurality of incremental detents is provided by a first threaded portion and wherein the at least one first projection is provided by a second threaded portion screwed to the first threaded portion;
a first intermediate structure having the first threaded portion and rotatably coupled to said one of the circuit board assembly and the electronic component while retained against linear movement in both directions along the first axis; and
wherein the electronic component includes a post including a third threaded portion, wherein the third threaded portion is screwed to the first threaded portion to retain the first intermediate structure and the first threaded portion against linear movement in both directions along the first axis.

40. A circuit board assembly comprising:
a circuit board;
an electronic component;
a plurality of incremental detents coupled to one of the circuit board and electronic component and retained relative to said one of the circuit board and electronic component against linear movement in both directions along a first axis; and
at least one projection coupled to the other of the circuit board and the electronic component and retained against linear movement along the first axis, wherein the at least one projection is received within at least one of the plurality of detents to retain the electronic component relative to the circuit board against linear movement in both directions along the first axis, wherein the electronic component includes a power supply having a mass cantilevered relative to the circuit board, wherein the plurality of incremental detents and the at least one projection cooperate to support the cantilevered mass relative to the circuit board.

* * * * *